United States Patent
Maejima et al.

(10) Patent No.: US 12,400,714 B2
(45) Date of Patent: Aug. 26, 2025

(54) SEMICONDUCTOR STORAGE DEVICE

(71) Applicant: Kioxia Corporation, Tokyo (JP)

(72) Inventors: Hiroshi Maejima, Tokyo (JP); Katsuaki Isobe, Yokohama Kanagawa (JP); Keita Kimura, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 178 days.

(21) Appl. No.: 18/337,605

(22) Filed: Jun. 20, 2023

(65) Prior Publication Data

US 2024/0096417 A1 Mar. 21, 2024

(30) Foreign Application Priority Data

Sep. 21, 2022 (JP) ................. 2022-150519

(51) Int. Cl.
| | |
|---|---|
| G11C 16/04 | (2006.01) |
| G11C 5/06 | (2006.01) |
| G11C 16/14 | (2006.01) |
| G11C 16/26 | (2006.01) |

(52) U.S. Cl.
CPC .......... *G11C 16/0483* (2013.01); *G11C 5/063* (2013.01); *G11C 16/14* (2013.01); *G11C 16/26* (2013.01)

(58) Field of Classification Search
CPC ..... G11C 16/0483; G11C 5/063; G11C 16/14; G11C 16/26
USPC .................................................. 365/189.011
See application file for complete search history.

(56) References Cited

U.S. PATENT DOCUMENTS

| | | | |
|---|---|---|---|
| 7,057,915 B2 | 6/2006 | Futasuyama | |
| 9,147,481 B2 | 9/2015 | Kamata | |
| 9,171,631 B2 | 10/2015 | Kamata et al. | |
| 9,570,173 B2 | 2/2017 | Yoshihara et al. | |
| 2007/0097724 A1* | 5/2007 | Tomida | G11C 7/22 365/63 |
| 2013/0070528 A1* | 3/2013 | Maeda | H10B 43/35 365/185.11 |
| 2024/0096417 A1 | 3/2024 | Maejima et al. | |

FOREIGN PATENT DOCUMENTS

| | | |
|---|---|---|
| JP | 2005191413 A | 7/2005 |
| JP | 2013232258 A | 11/2013 |
| JP | 5755596 B2 | 6/2015 |
| JP | 2024044778 A | 4/2024 |
| WO | 2015037088 A1 | 3/2015 |

* cited by examiner

*Primary Examiner* — Amir Zarabian
*Assistant Examiner* — Daniel John King
(74) *Attorney, Agent, or Firm* — Holtz, Holtz & Volek PC

(57) ABSTRACT

In one embodiment, a semiconductor storage device includes a string that has one end electrically connected to a bit line, and another end electrically connected to a source line, and includes a plurality of memory cells. An operation of writing data to each of a plurality of adjacent first memory cells among the plurality of memory cells is sequentially performed in a direction from a first memory cell on a side of the source line to a first memory cell on a side of the bit line. An operation of reading data from each of the plurality of adjacent first memory cells is performed to allow a current to flow through the string in a first direction from the source line to the bit line.

18 Claims, 12 Drawing Sheets

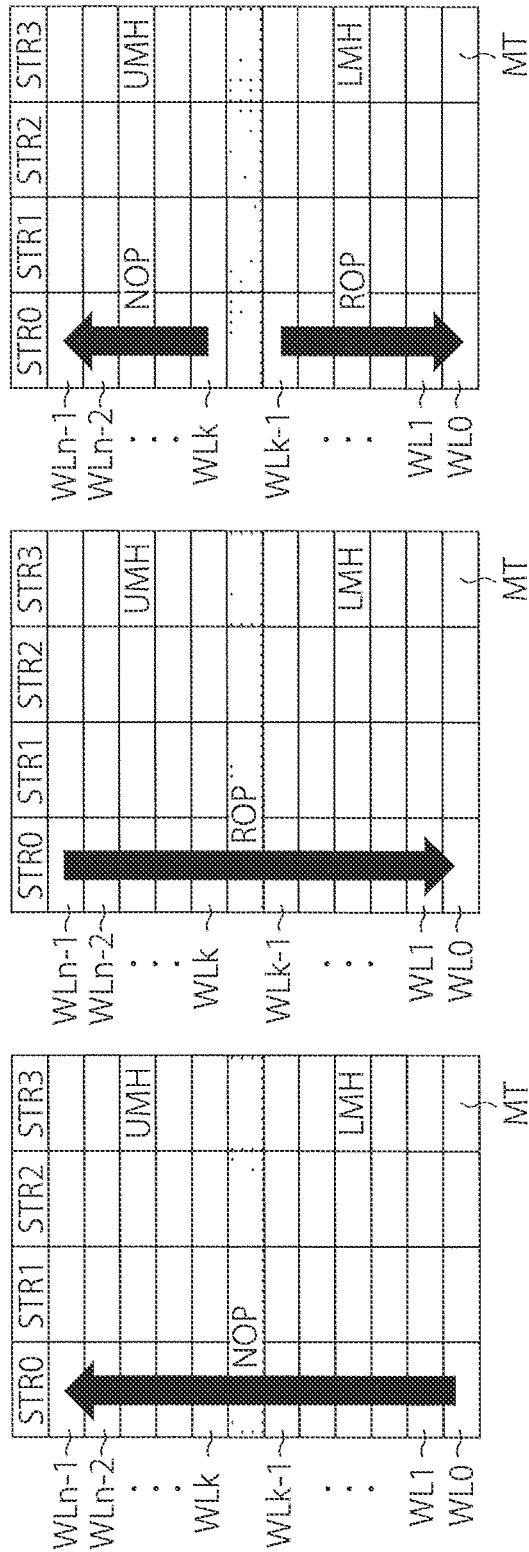

SEMICONDUCTOR STORAGE DEVICE

CROSS REFERENCE TO RELATED APPLICATION

This application is based upon and claims the benefit of priority from the prior Japanese Patent Application No. 2022-150519, filed on Sep. 21, 2022, the entire contents of which are incorporated herein by reference.

FIELD

Embodiments described herein relate to a semiconductor storage device.

BACKGROUND

In a NAND memory, when data is written to a plurality of memory cells in a NAND string, there is a problem that the writing speed becomes slow due to the reading for verification purposes.

BRIEF DESCRIPTION OF THE DRAWINGS

FIGS. 5A to 5C are diagrams for illustrating the operation of the memory system of the first embodiment;

FIGS. 10A to 12B are diagrams for illustrating the operation of a memory system of the second embodiment.

DETAILED DESCRIPTION

Embodiments will now be explained with reference to the accompanying drawings. In FIGS. 1 to 12B, identical components are denoted by identical reference signs, and overlapped description will be omitted.

In one embodiment, a semiconductor storage device includes a string that has one end electrically connected to a bit line, and another end electrically connected to a source line, and includes a plurality of memory cells. An operation of writing data to each of a plurality of adjacent first memory cells among the plurality of memory cells is sequentially performed in a direction from a first memory cell on a side of the source line to a first memory cell on a side of the bit line. An operation of reading data from each of the plurality of adjacent first memory cells is performed to allow a current to flow through the string in a first direction from the source line to the bit line.

First Embodiment

Figure 1:
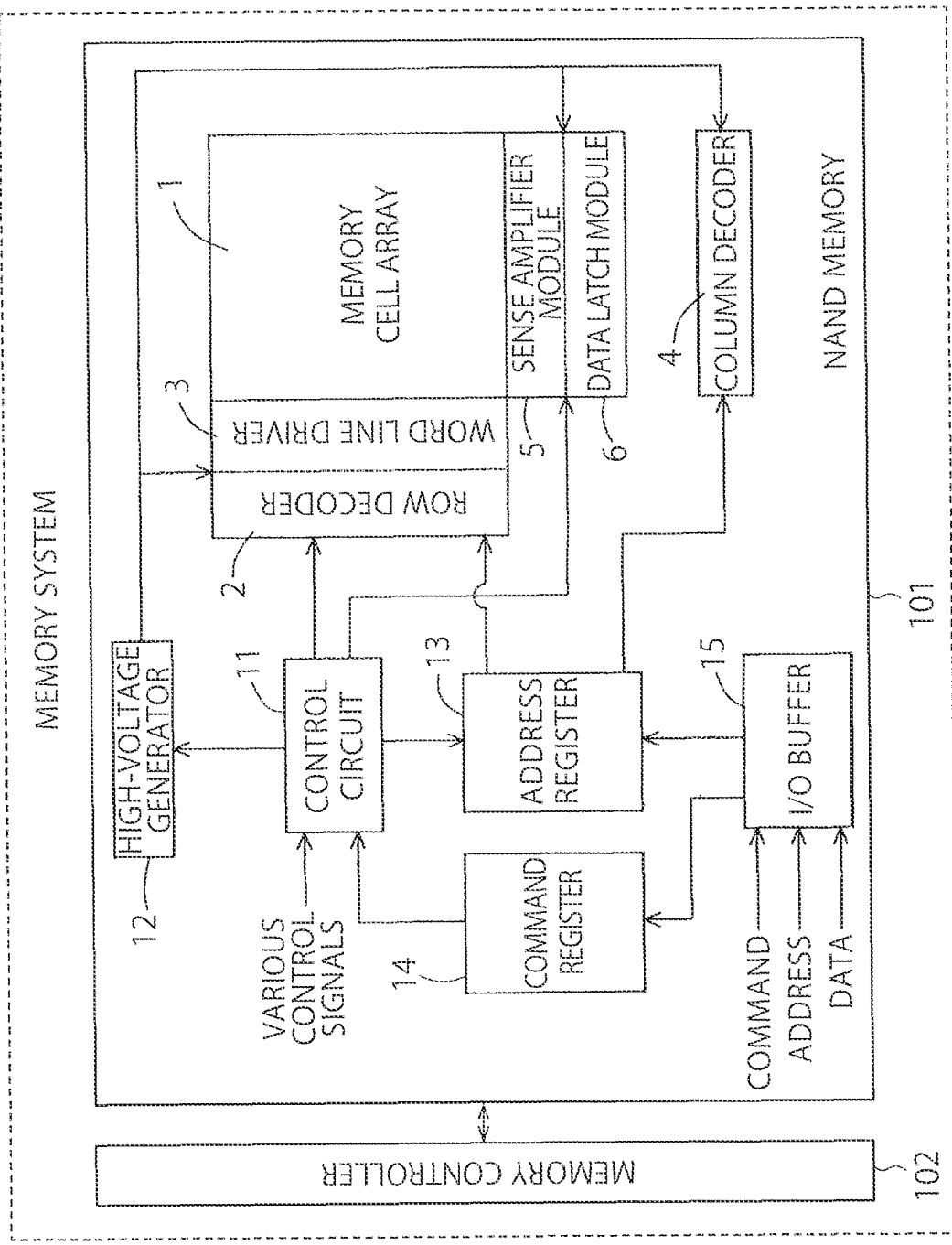
FIG. 1 is a block diagram illustrating the configuration of a memory system of a first embodiment.

FIG. 1 is a block diagram illustrating the configuration of a memory system of a first embodiment.

The memory system of the present embodiment includes a NAND memory 101 and a memory controller 102. The NAND memory 101 is an example of a semiconductor storage device, and the memory controller 102 is an example of a controller. The NAND memory 101 includes a memory cell array 1, a row decoder 2, a word line driver 3, a column decoder 4, a sense amplifier module 5, a data latch module 6, a control circuit 11, a high-voltage generator 12, an address register 13, a command register 14, and an I/O (Input/Output) buffer 15.

The operation of the NAND memory 101 is controlled by the memory controller 102. The memory controller 102 operates in response to a request from a host device (not illustrated). For example, the memory controller 102 controls data reading from the NAND memory 101 in response to a read request from the host device. In addition, the memory controller 102 controls data writing to the NAND memory 101 in response to a write request from the host device. Further, the memory controller 102 controls data erasing from the NAND memory 101 in response to an erase request from the host device.

The memory cell array 1 includes a plurality of memory cells. The memory cell array 1 of the present embodiment is a three-dimensional semiconductor memory obtained by arranging such memory cells in a three-dimensional array. The memory cell array 1 of the present embodiment includes a plurality of blocks. Each block includes a plurality of pages. Each page includes a plurality of memory cells. Each block is used as a basic unit of data erasing, and each page is used as a basic unit of data writing and a basic unit of data reading. Further details of the memory cell array 1 will be described later.

The row decoder 2 receives a row address from the address register 13, and decodes the row address. The word line driver 3 supplies a voltage to a word line based on the decoded row address, and drives the word line.

The column decoder 4 receives a column address from the address register 13, and decodes the column address. The column decoder 4 further determines whether to transfer data held in the data latch module 6 to a data bus based on the decoded column address.

In a write operation, the sense amplifier module 5 transfers data to be written, which has been received from the memory controller 102, to the memory cell array 1. Meanwhile, in a read operation, the sense amplifier module 5 transfers read data, which has been detected from the memory cell array 1, to the memory controller 102. Data transfer between the sense amplifier module 5 and the memory controller 102 is performed via the data latch module 6.

In a write operation, the data latch module 6 holds the data to be written obtained from the memory controller 102. The data to be written held in the data latch module 6 is transferred to the sense amplifier module 5. Meanwhile, in a read operation, the data latch module 6 holds the read data obtained from the sense amplifier module 5. The read data held in the data latch module 6 is transferred to the memory controller 102.

The control circuit 11 controls various operations of the NAND memory 101. For example, the control circuit 11 controls the operations of the row decoder 2, the word line driver 3, the column decoder 4, the sense amplifier module 5, the data latch module 6, the high-voltage generator 12, the I/O buffer 15, and the like based on a command held in the command register 14. This makes it possible to execute a read operation, a write operation, an erase operation, and the like based on the command.

The high-voltage generator 12 generates a high voltage to be used for a read operation, a write operation, an erase operation, and the like. The high voltage generated by the high-voltage generator 12 is supplied to the word line driver 3 and the sense amplifier module 5.

The address register 13 holds address information received by the NAND memory 101 from the memory controller 102. The command register 14 holds a command received by the NAND memory 101 from the memory controller 102.

The I/O buffer 15 buffers a command, address information, and data received via an input terminal; and data to be output from an output terminal. Further, the I/O buffer 15 respectively transfers the command, the address information, and the data received via the input terminal to the command register 14, the address register 13, and the data bus.

Figure 2:
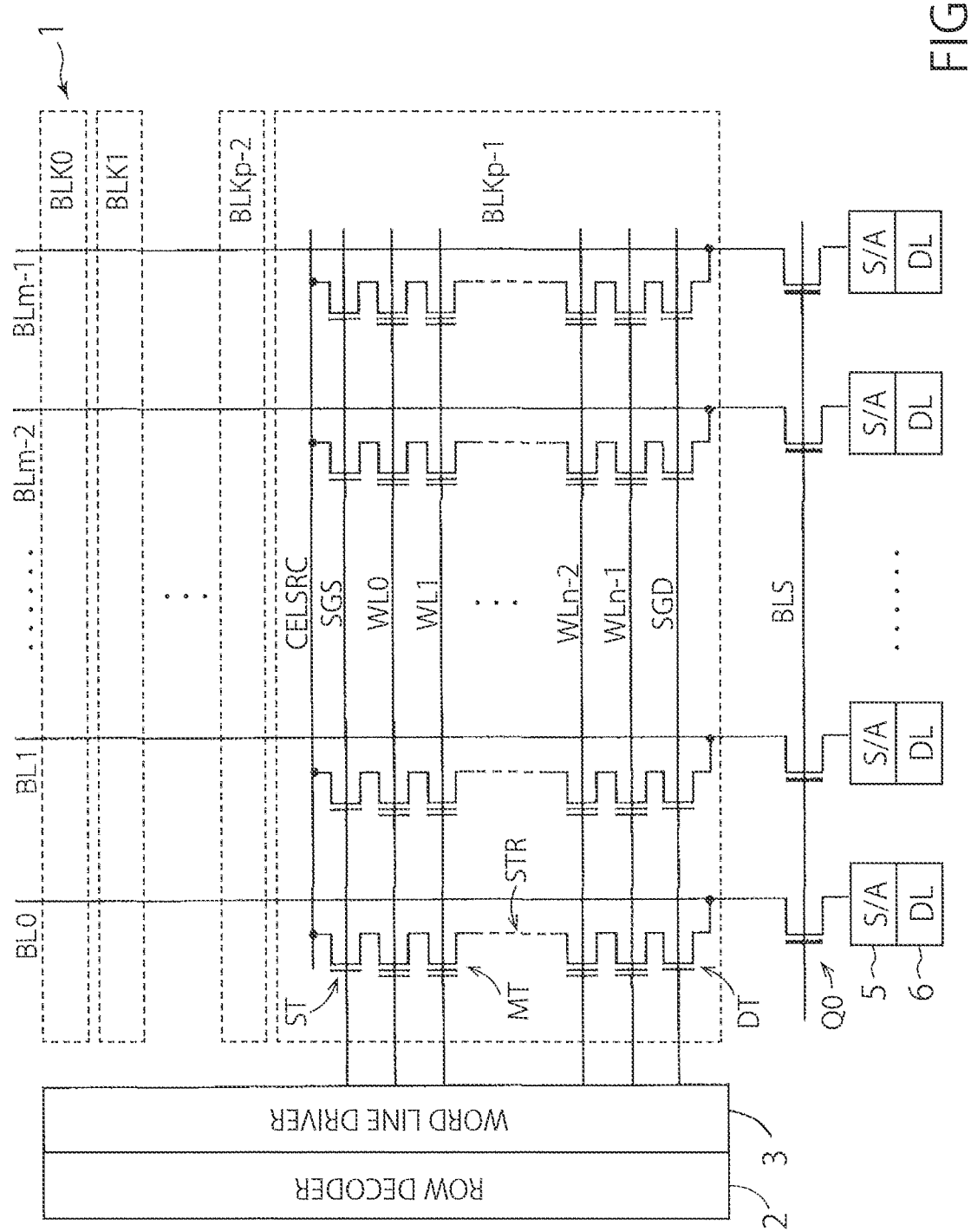
FIG. 2 is a circuit diagram illustrating the configuration of a memory cell array 1 of the first embodiment.

FIG. 2 is a circuit diagram illustrating the configuration of the memory cell array 1 of the first embodiment.

FIG. 2 illustrates p blocks BLK0 to BLKp−1 (where p is an integer of not less than 2) included in the memory cell array 1. Hereinafter, the configuration of each block will be described mainly with reference to the block BLKp−1.

The block BLKp−1 includes m (where m is an integer of not less than 2) NAND strings STRs. Each NAND string STR is arranged between one of m bit lines BL0 to BLm−1 and a cell source line CELSRC. Each NAND string STR also includes n (where n is an integer of not less than 2) memory cell transistors (i.e., memory cells) MT, a source-side select transistor ST, and a drain-side select transistor DT. Each memory cell transistor MT is electrically connected to one of n word lines WL0 to WLn−1. The source-side select transistor ST is electrically connected to a source-side select line SGS. The drain-side select transistor DT is electrically connected to a drain-side select line SGD.

FIG. 2 further illustrates m sense amplifiers (S/As) in the sense amplifier module 5, m data latches (DLs) in the data latch module 6, and m select transistors Q0 electrically connected to a select line BLS. Each sense amplifier can be electrically connected to one of the bit lines BL0 to BLm−1 via the corresponding select transistor Q0. Each data latch can be electrically connected to the corresponding sense amplifier.

Figure 3:
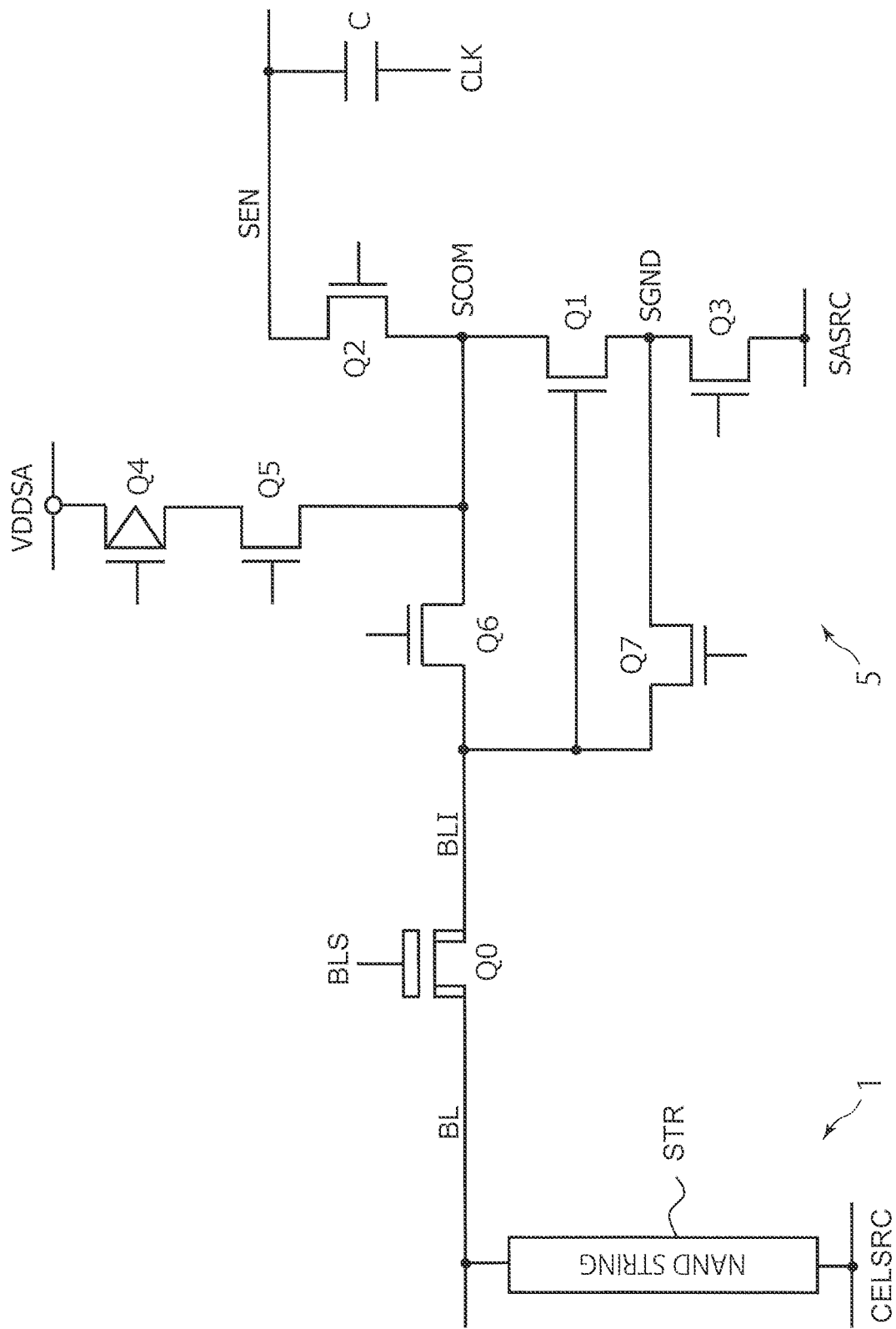
FIG. 3 is a circuit diagram illustrating the configuration of a sense amplifier module 5 and the like of the first embodiment.

FIG. 3 is a circuit diagram illustrating the configuration of the sense amplifier module 5 and the like of the first embodiment.

Each sense amplifier in the sense amplifier module 5 includes transistors Q1 to Q7 and a capacitor C as illustrated in FIG. 3.

The transistors Q4, Q5, Q1, and Q3 are arranged in series between a VDDSA node and a SASRC node. A SCOM node is located between the transistor Q5 and the transistor Q1, and a SGND node is located between the transistor Q1 and the transistor Q3. The transistor Q6 is arranged between a BLI line and the SCOM node, and the transistor Q7 is arranged between the BLI line and the SGND node. The gate of the transistor Q1 is electrically connected to the BLI line. The BLI line can be electrically connected to a bit line BL via the select transistor Q0. The bit line BL is one of the bit lines BL0 to BLm−1 illustrated in FIG. 2.

The source of the transistor Q2 is electrically connected to the SCOM node. The drain of the transistor Q2 is electrically connected to a SEN line. The capacitor C includes one electrode electrically connected to the SEN line, and the other electrode to be supplied with a CLK signal.

Each sense amplifier may operate based on an ABL (All Bit Line) scheme so that a current flowing from the bit line BL to the cell source line CELSRC is detected, or a DSA (Diode Sense ABL) scheme so that a current flowing from the cell source line CELSRC to the bit line BL is detected. Each sense amplifier may have a configuration other than the configuration illustrated in FIG. 3, and may operate based on a scheme other than the ABL scheme or the DSA scheme.

Figure 4:
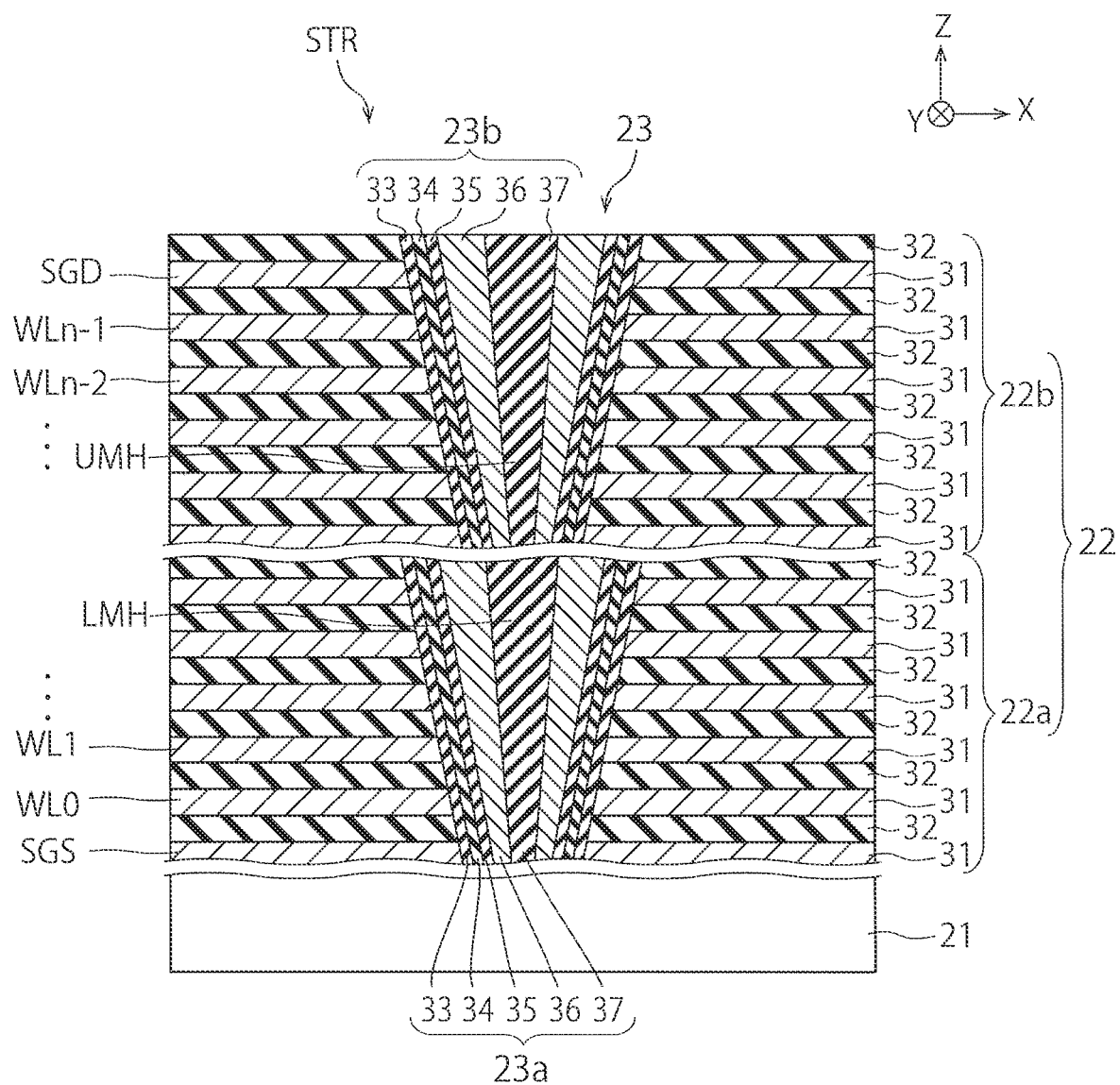
FIG. 4 is a cross-sectional view illustrating the structure of a NAND memory 101 of the first embodiment.

FIG. 4 is a cross-sectional view illustrating the structure of the NAND memory 101 of the first embodiment. FIG. 4 illustrates the structure of the memory cell array 1 and the like in the NAND memory 101.

The NAND memory 101 includes a substrate 21, a stacked film 22, and a columnar portion 23. The stacked film 22 includes a lower stacked film 22a and an upper stacked film 22b. The columnar portion 23 includes a lower columnar portion 23a and an upper columnar portion 23b. The stacked film 22 includes a plurality of electrode layers 31 and a plurality of insulators 32. The columnar portion 23 includes a block insulator 33, a charge storage layer 34, a tunnel insulator 35, a channel semiconductor layer 36, and a core insulator 37.

The substrate 21 is a semiconductor substrate, such as a Si (silicon) substrate, for example. FIG. 4 illustrates the X-direction and the Y-direction that are parallel with the surface of the substrate 21 and are perpendicular to each other, and also illustrates the Z-direction perpendicular to the surface of the substrate 21. In this specification, the +Z-direction is handled as the upward direction, and the −Z-direction is handled as the downward direction. The −Z-direction may either coincide with or not coincide with the direction of gravity. The +Z-direction is an example of a first direction, and the −Z-direction is an example of a second direction.

The lower stacked film 22a is formed on the substrate 21. The upper stacked film 22b is formed on the lower stacked film 22a. The lower stacked film 22a includes a plurality of electrode layers 31 and a plurality of insulators 32 alternately stacked on the substrate 21. The upper stacked film 22b includes a plurality of electrode layers 31 and a plurality of insulators 32 alternately stacked on the lower stacked film 22a. Each electrode layer 31 in the stacked film 22 is a W (tungsten) layer, for example. Each insulator 32 in the stacked film 22 is a $SiO_2$ film (i.e., a silicon oxide film), for example. The stacked film 22 may be formed on the substrate 21 either directly or with another film interposed therebetween.

The electrode layers 31 in the stacked film 22 include the n word lines WL0 to WLn−1, the source-side select line SGS, and the drain-side select line SGD described above. The lower stacked film 22a includes some of the word lines WL0 to WLn−1 and the source-side select line SGS. The lowermost electrode layer 31 in the lower stacked film 22a functions as the source-side select line SGS. The upper stacked film 22b includes the others of the word lines WL0 to WLn−1 and the drain-side select line SGD. The uppermost electrode layer 31 in the upper stacked film 22b functions as the drain-side select line SGD. The source-side select line SGS may be formed of two or more electrode layers 31, and the drain-side select line SGD may also be formed of two or more electrode layers 31.

The lower columnar portion 23a is formed in a lower memory hole LMH provided in the lower stacked film 22a. The upper columnar portion 23b is formed in an upper memory hole UMH provided in the upper stacked film 22b. The upper memory hole UMH is formed above the lower memory hole LMH, and therefore, the upper columnar portion 23b is formed above the lower columnar portion 23a. The lower memory hole LMH and the upper memory hole UMH are coupled together with a joint portion (not illustrated) provided between the lower memory hole LMH and the upper memory hole UMH.

Each of the lower columnar portion 23a and the upper columnar portion 23b is formed of the same block insulator 33, charge storage layer 34, tunnel insulator 35, channel semiconductor layer 36, and core insulator 37. Therefore, the channel semiconductor layer 36 in the upper columnar portion 23b is electrically connected to the channel semiconductor layer 36 in the lower columnar portion 23a. The block insulator 33, the charge storage layer 34, the tunnel insulator 35, the channel semiconductor layer 36, and the core insulator 37 are formed in this order in each of the lower memory hole LMH and the upper memory hole UMH. The block insulator 33 is a $SiO_2$ film, for example. The charge storage layer 34 is an insulator, such as a SiN film (i.e., a silicon nitride film), or a semiconductor layer, such as a polysilicon layer, for example. The tunnel insulator 35 is a $SiO_2$ film, for example. The channel semiconductor layer 36 is a polysilicon layer, for example. The core insulator 37 is a $SiO_2$ film, for example.

The NAND memory 101 includes a plurality of columnar portions 23 in the stacked film 22. FIG. 4 illustrates one of such columnar portions 23. Each columnar portion 23 forms a single NAND string STR. The columnar portion 23 illustrated in FIG. 4 forms the plurality of memory cells (i.e., memory cell transistors) MT together with the word lines WL0 to WLn−1, and forms the source-side transistor ST together with the source-side select line SGS, and also forms the drain-side transistor DT together with the drain-side select line SGD.

When the NAND memory 101 of the present embodiment is manufactured by bonding a plurality of substrates together, the substrate 21 need not be provided. For example, after a plurality of substrates are bonded together, a substrate on the bottom surface side of the stacked film 22 (i.e., the substrate 21) may be removed, and a substrate on the top surface side of the stacked film 22 may be left.

FIGS. 5A to 5C are diagrams for illustrating the operation of the memory system of the first embodiment.

Four columns of quadrangles illustrated in FIG. 5A represent a plurality of memory cells MT included in four NAND strings STR0 to STR3 in the memory cell array 1. Four memory cells MT in each row are electrically connected to one of the n word lines WL0 to WLn−1. For example, four memory cells MT in the bottom row are electrically connected to the word line WL0. Meanwhile, four memory cells MT in the top row are electrically connected to the word line WLn−1.

Dot-hatched quadrangles indicate the position of the joint portion of the lower memory hole LMH and the upper memory hole UMH. Therefore, the memory cells MT electrically connected to the word lines WL0 to WLk−1 are located in the lower memory hole LMH (i.e., the lower columnar portion 23a), and the memory cells MT electrically connected to the word lines WLk to WLn−1 are located in the upper memory hole UMH (i.e., the upper columnar portion 23b). Note that "k" is an integer that satisfies 1≤k≤n−1.

FIG. 5A illustrates the operation of the NAND memory 101 in a normal mode. In such a case, the sense amplifier module 5, in writing data to the memory cells MT on each NAND string STR, sequentially writes data in a direction from the memory cells MT on the word line WL0 to the memory cells MT on the word line WLn−1. That is, the sense amplifier module 5 sequentially writes data in a direction from the lower end to the upper end of the columnar portion 23 (i.e., in the +Z-direction). In FIG. 5A, such a direction is indicated by an arrow. In FIG. 5A, writing to the memory cells MT on the NAND string STR0 is performed in the direction of the arrow. Such writing is referred to as a NOP (Normal Order Program).

FIG. 5B illustrates the operation of the NAND memory 101 in another normal mode. In such a case, the sense amplifier module 5, in writing data to the memory cells MT on each NAND string STR, sequentially writes data in a direction from the memory cells MT on the word line WLn−1 to the memory cells MT on the word line WL0. That is, the sense amplifier module 5 sequentially writes data in a direction from the upper end to the lower end of the columnar portion 23 (i.e., in the −Z-direction). In FIG. 5B, such a direction is indicated by an arrow. In FIG. 5B, writing to the memory cells MT on the NAND string STR0 is performed in the direction of the arrow. Such writing is referred to as a ROP (Reverse Order Program).

FIG. 5C illustrates the operation of the NAND memory 101 in a sub-block mode (SBM). The four NAND strings STR0 to STR3 illustrated in FIG. 5C are included in a single block. In the SBM, such a block is divided into two sub-blocks, and the block is accessed in a different way for each sub-block. In FIG. 5C, the memory cells MT in the lower memory hole LMH (i.e., the lower columnar portion 23a) belong to one sub-block, and the memory cells MT in the upper memory hole UMH (i.e., the upper columnar portion 23b) belong to the other sub-block. In such a case, the joint portion corresponds to the boundary between the two sub-blocks. The boundary between the two sub-blocks may be located at a position different from the joint portion. For example, the boundary may be located above or below the joint portion. Such sub-blocks are examples of a first sub-block and a second sub-block.

In FIG. 5C, the sense amplifier module 5, in writing data to the memory cells MT on each NAND string STR, handles the memory cells MT in the lower memory hole LMH and the memory cells MT in the upper memory hole UMH in different ways. Specifically, the sense amplifier module 5, in writing data to the memory cells MT in the lower memory hole LMH, sequentially writes data in a direction from the memory cells MT on the word line WLk−1 to the memory cells MT on the word line WL0. That is, writing is sequentially performed in a direction from the upper end to the lower end of the lower columnar portion 23a (i.e., in the −Z-direction). Meanwhile, the sense amplifier module 5, in writing data to the memory cells MT in the upper memory hole UMH, sequentially writes data in a direction from the memory cells MT on the word line WLk to the memory cells MT on the word line WLn−1. That is, writing is sequentially performed in a direction from the lower end to the upper end of the upper columnar portion 23a (i.e., in the +Z-direction).

In FIG. 5C, such directions are indicated by arrows. In FIG. 5C, writing to the memory cells MT on the NAND string STR0 is sequentially performed in the directions of the arrows. The ROP is performed on the memory cells MT in the lower memory hole LMH. The NOP is performed on the memory cells MT in the upper memory hole UMH.

The sense amplifier module 5, in writing data to the memory cells MT, applies a writing pulse to the NAND string STR. At this time, before the writing pulse is applied to the NAND string STR, precharge is performed to supply positive charges into the NAND string STR from the bit line or the source line. This makes it possible to pull the remaining electrons out of the channel semiconductor layer 36. In FIG. 5A, precharge of each NAND string STR is performed from the side of the bit line by flowing a current through the drain-side select line SGD. In FIG. 5B, precharge of each NAND string STR is performed from the side of the source line by flowing a current through the source-side select line SGS. In FIG. 5C, precharge of each NAND string STR in the lower memory hole LMH is performed from the side of the source line, and precharge of each NAND string STR in the upper memory hole UMH is performed from the side of the bit line.

The NAND memory 101 of the present embodiment may be operable in three operation modes including the normal mode in FIG. 5A, the normal mode in FIG. 5B, and the SBM in FIG. 5C. Meanwhile, the NAND memory 101 of the present embodiment may be operable only in two operation modes including the normal mode in FIG. 5A and the SBM in FIG. 5C, or operable only in two operation modes including the normal mode in FIG. 5B and the SBM in FIG. 5C.

Next, the foregoing operation modes will be described in further detail with reference to FIGS. 5A to 5C.

When the ROP in FIG. 5B is adopted instead of the NOP in FIG. 5A to write data to the memory cells MT, the writing direction coincides with the direction of a current flow during reading. This makes it possible to suppress increases in the widths of various distributions due to the neighbor WL influence (NWI). Examples of such distributions include a distribution of a threshold voltage. However, in the SBM in FIG. 5C, if the ROP is applied to writing to the memory cells MT in the upper memory hole UMH, and if the cells in the sub-block on the LMH side already have data written thereto, the foregoing precharge is difficult to perform, which is problematic in that write disturbance is difficult to suppress.

Therefore, when data is written to the memory cells MT on the UMH side, the NOP is applied as illustrated in FIG. 5C in the present embodiment. This makes it possible to easily perform the foregoing precharge.

Meanwhile, there is a possibility that due to the neighbor WL influence, the writing speed in writing data to the memory cells MT in the upper memory hole UMH based on the NOP may become lower than the writing speed in writing data to the memory cells MT in the lower memory hole LMH based on the ROP. A method for solving such a problem will be described later.

Figure 6A:
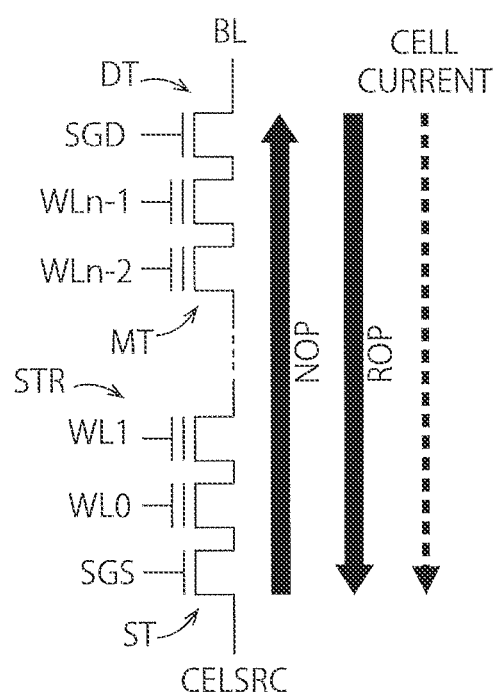
FIGS. 6A and 6B are circuit diagrams for illustrating the operation of the memory system of the first embodiment.
Figure 6B:
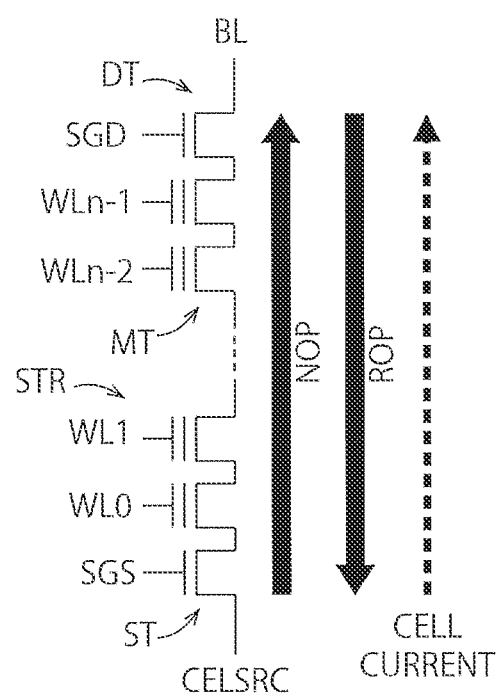

FIGS. 6A and 6B are circuit diagrams for illustrating the operation of the memory system of the first embodiment.

FIG. 6A illustrates a single NAND string STR. When the NOP is adopted for writing to the NAND string STR, the writing is performed in a direction from the source-side select transistor ST to the drain-side select transistor DT. Meanwhile, when the ROP is adopted for writing to the NAND string STR, the writing is performed in a direction from the drain-side select transistor DT to the source-side select transistor ST.

FIG. 6A illustrates the plurality of memory cells MT in the NAND string STR. The sense amplifier module 5 performs reading for verification purposes on the memory cells MT when writing data to the memory cells MT. The reading for verification purposes includes reading data from the memory cells MT to confirm if the data has been accurately written to the memory cells MT. When reading for verification purposes is performed, a cell current flows through the channel semiconductor layer 36 in the NAND string STR.

FIG. 6A illustrates an example of such a cell current. In FIG. 6A, reading for verification purposes is performed to allow a cell current to flow in a direction from the drain-side select transistor DT to the source-side select transistor ST. That is, the direction of a cell current that flows during reading performed for verification purposes is the same as the direction of the ROP.

In FIG. 6A, when the ROP is adopted for writing to the NAND string STR, a cell current flows in the same direction as the direction of the ROP during reading performed for verification purposes. This makes it possible to reduce parasitic resistance in the NAND string STR, and increase the writing speed for the NAND string STR.

Meanwhile, in FIG. 6A, when the NOP is adopted for writing to the NAND string STR, a cell current flows in a direction opposite to the direction of the NOP during reading performed for verification purposes. This results in increased parasitic resistance in the NAND string STR, and a slower writing speed for the NAND string STR.

FIG. 6B also illustrates a single NAND string STR. In FIG. 6B, reading for verification purposes is performed to allow a cell current to flow in a direction from the source-side select transistor ST to the drain-side select transistor DT. That is, the direction of a cell current that flows during reading performed for verification purposes is the same as the direction of the NOP. This makes it possible to increase the writing speed for the NAND string STR when the NOP is adopted.

When the sense amplifier module 5 of the present embodiment adopts the ROP for writing to the NAND string STR, the reading for verification purposes illustrated in FIG. 6A is adopted. Meanwhile, when the sense amplifier module 5 of the present embodiment adopts the NOP for writing to the NAND string STR, the reading for verification purposes illustrated in FIG. 6B is adopted. This makes it possible to increase the writing speed for the NAND string STR when the NOP and the ROP are adopted.

The methods of performing reading for verification purposes illustrated in FIGS. 6A and 6B may be applied to reading other than the reading for verification purposes. This allows reading for verification purposes and reading other than the reading for verification purposes to be performed with the same method, which makes it possible to simplify the control of the read operation. The writing methods illustrated in FIGS. 6A and 6B may also be applied to the SBM. The details will be described later.

Figures 7A, 7B, 7C:
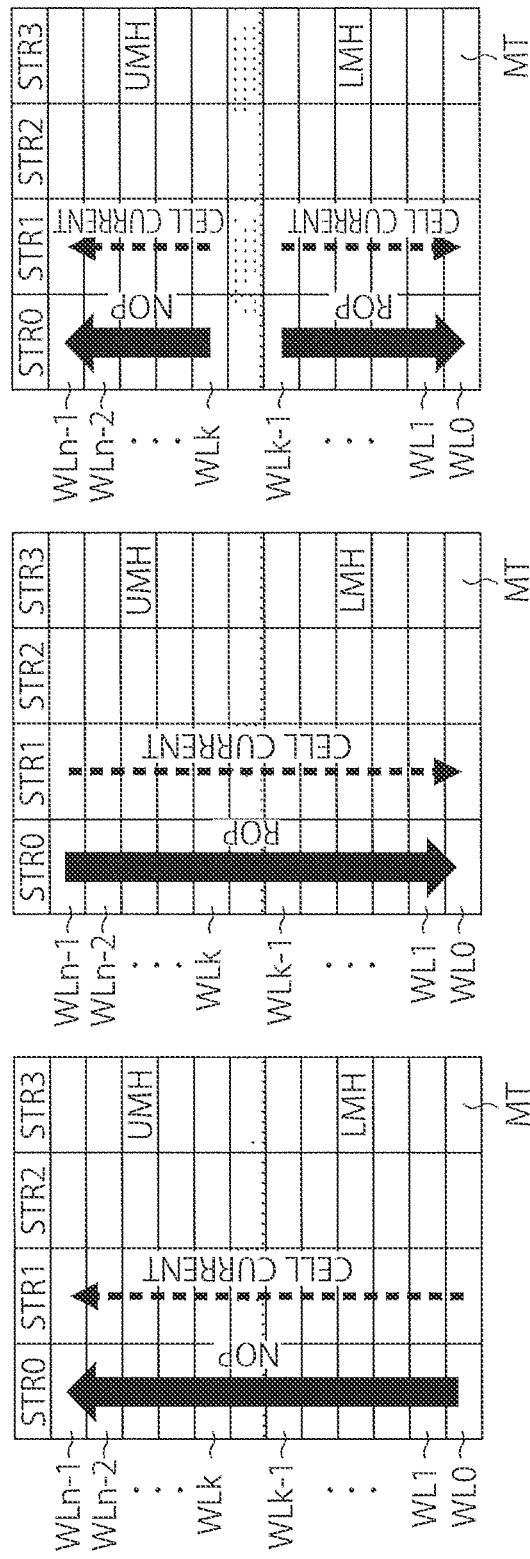
FIGS. 7A to 7C are diagrams for illustrating the operation of the memory system of the first embodiment.

FIGS. 7A to 7C are diagrams for illustrating the operation of the memory system of the first embodiment.

FIG. 7A illustrates the operation of the NAND memory 101 in a normal mode as in FIG. 5A. In such a case, the sense amplifier module 5 adopts the NOP for writing to the NAND string STR. Further, the direction of a cell current that flows during reading performed for verification purposes is set to the same direction of the NOP. This makes it possible to increase the writing speed for the NAND string STR when the NOP is adopted.

FIG. 7B illustrates the operation of the NAND memory 101 in another normal node as in FIG. 5B. In such a case, the sense amplifier module 5 adopts the ROP for writing to the NAND string STR. Further, the direction of a cell current that flows during reading performed for verification purposes is set to the same direction of the ROP. This makes it possible to increase the writing speed for the NAND string STR when the ROP is adopted.

FIG. 7C illustrates the operation of the NAND memory 101 in the SBM as in FIG. 5C. In such a case, the sense amplifier module 5 adopts the ROP for writing to the memory cells MT in the lower memory hole LMH, and adopts the NOP for writing to the memory cells MT in the upper memory hole UMH. Further, the direction of a cell current that flows in the lower memory hole LMH during reading performed for verification purposes is set to the same direction as the direction of the ROP, and the direction of a cell current that flows in the upper memory hole UMH during reading performed for verification purposes is set to the same direction as the direction of the NOP. This makes it possible to increase the writing speed for the NAND string STR when the SBM is adopted. The NAND string STR in the lower memory hole LMH is an example of a second portion, and the NAND string STR in the upper memory hole UMH is an example of a first portion. The memory cells MT in the lower memory hole LMH are examples of second memory cells, and the memory cells MT in the upper memory hole UMH are examples of first memory cells.

Figures 8A, 8B, 8C:
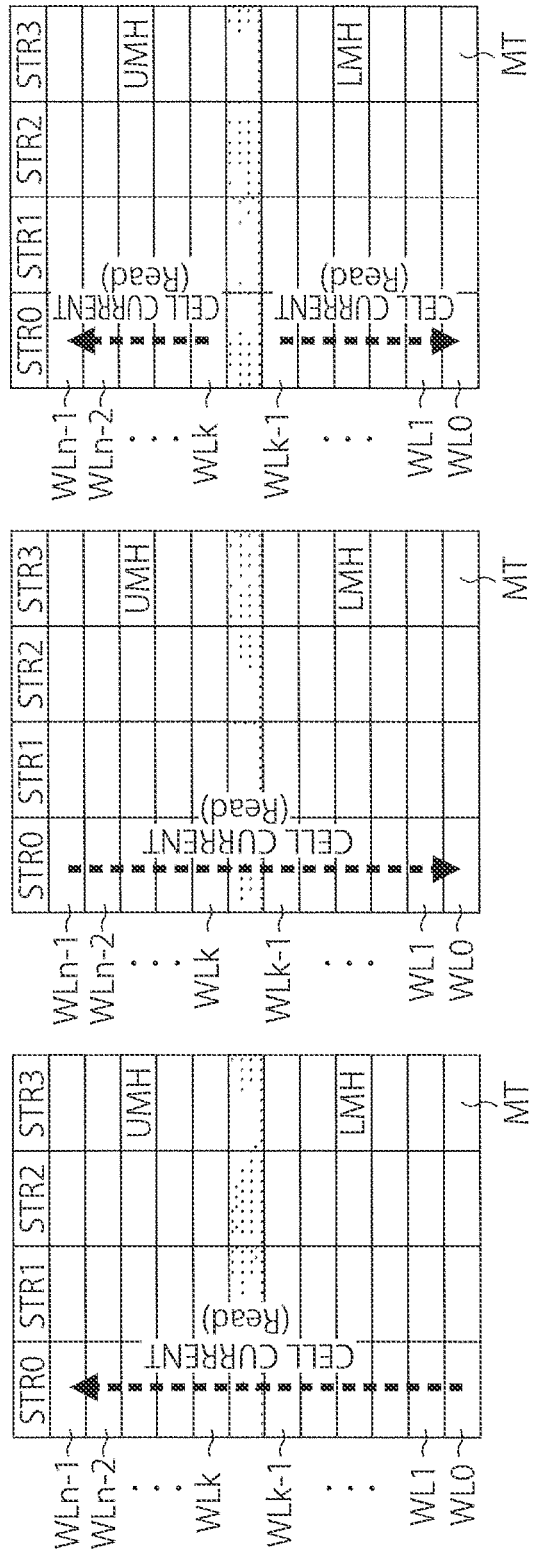
FIGS. 8A to 8C are diagrams for illustrating the operation of the memory system of the first embodiment.

FIGS. 8A to 8C are diagrams for illustrating the operation of the memory system of the first embodiment.

FIG. 8A illustrates the operation of the NAND memory 101 in a normal mode as in FIGS. 5A and 7A. In such a case, the sense amplifier module 5 adopts the NOP for writing to the NAND string STR. Further, the direction of a cell current that flows during reading other than reading performed for verification purposes is set to the same direction as the direction of the NOP. This allows data, which has been written based on the NOP, to be read using a cell current flowing in the same direction as the direction of the NOP.

FIG. 8B illustrates the operation of the NAND memory 101 in another normal mode as in FIGS. 5B and 7B. In such a case, the sense amplifier module 5 adopts the ROP for writing to the NAND string STR. Further, the direction of a cell current that flows during reading other than reading performed for verification purposes is set to the same direction as the direction of the ROP. This allows data, which has been written based on the ROP, to be read using a cell current flowing in the same direction as the direction of the ROP.

FIG. 8C illustrates the operation of the NAND memory 101 in the SBM as in FIGS. 5C and 7C. In such a case, the sense amplifier module 5 adopts the ROP for writing to the memory cells MT in the lower memory hole LMH, and adopts the NOP for writing to the memory cells MT in the upper memory hole UMH. Further, the direction of a cell current that flows in the lower memory hole LMH during reading other than reading performed for verification purposes is set to the same direction as the direction of the ROP, and the direction of a cell current that flows in the upper memory hole UMH during reading other than reading performed for verification purposes is set to the same direction as the direction of the NOP. This allows data, which has been written based on the ROP, to be read using a cell current flowing in the same direction as the direction of the ROP, and allows data, which has been written based on the NOP, to be read using a cell current flowing in the same direction as the direction of the NOP.

As described above, the sense amplifier module 5 of the present embodiment sets the direction of a cell current that flows during data reading from a given NAND string STR to the same direction as the direction of writing data to the NAND string STR. For example, the ROP is adopted for writing to the memory cells MT in the lower memory hole LMH, and the direction of a cell current flow in the lower memory hole LMH is set to the same direction as the direction of the ROP. Further, the NOP is adopted for writing to the memory cells MT in the upper memory hole UMH, and the direction of a cell current flow in the upper memory hole UMH is set to the same direction as the direction of the NOP. Accordingly, the present embodiment makes it possible to increase the data writing speed for each NAND string STR.

The writing direction and the direction of a cell current that flows during reading (which includes reading performed for verification purposes) are controlled by the memory controller 102, for example. In such a case, the memory controller 102 outputs an instruction related to such directions to the NAND memory 101, and then, the sense amplifier module 5 in the NAND memory 101 controls the directions in response to the instruction. This makes it possible to implement the control illustrated in FIGS. 5A to 8C. This is also true of control illustrated in FIGS. 10A to 12B below.

Second Embodiment

Figure 9:
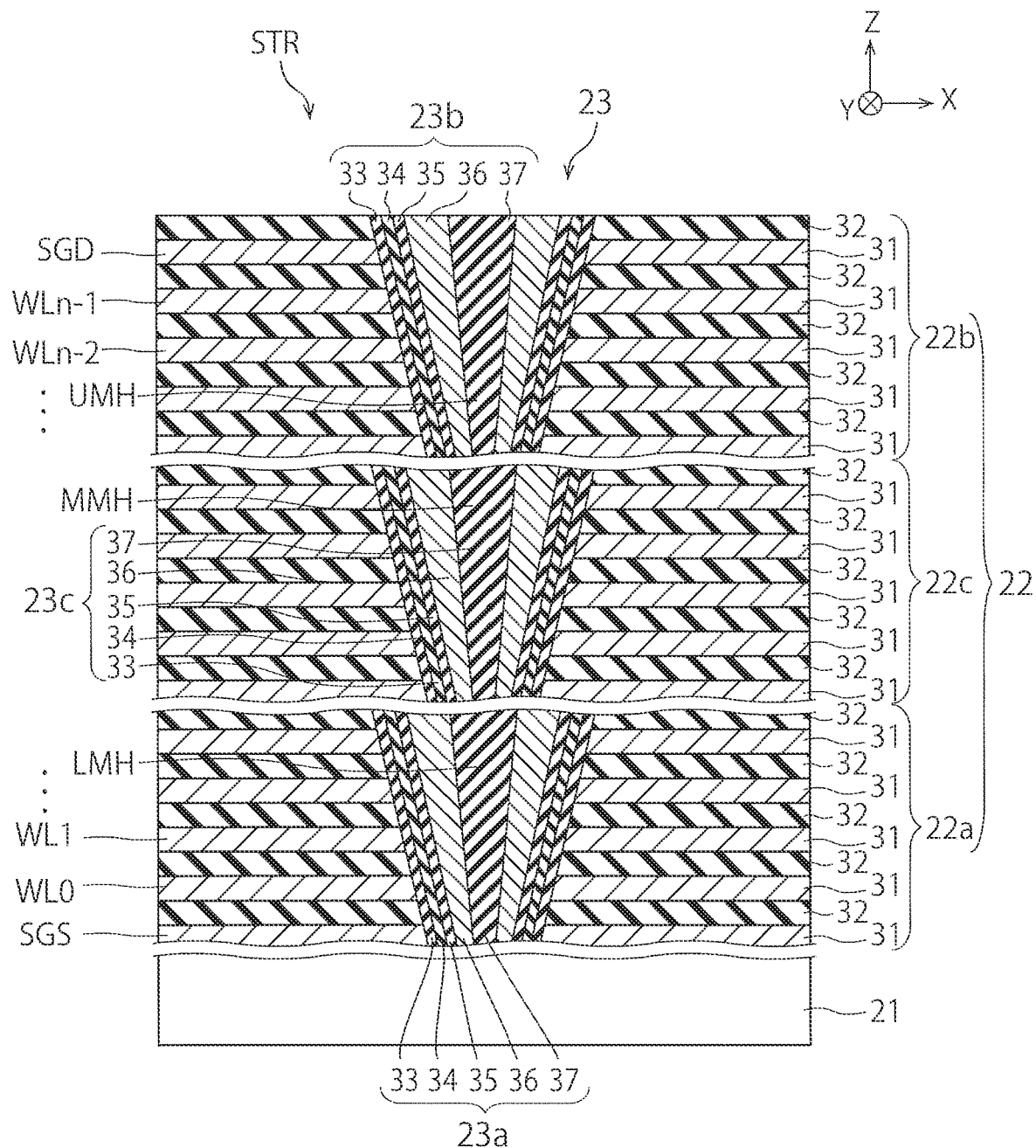
FIG. 9 is a cross-sectional view illustrating the structure of a NAND memory 101 of a second embodiment.

FIG. 9 is a cross-sectional view illustrating the structure of the NAND memory 101 of a second embodiment. FIG. 9 illustrates the structure of the memory cell array 1 and the like in the NAND memory 101 as in FIG. 4.

The NAND memory 101 of the present embodiment includes, in addition to the components of the NAND memory 101 of the first embodiment, an intermediate stacked film 22c in the stacked film 22, and an intermediate columnar portion 23c in the columnar portion 23.

The intermediate stacked film 22c is formed between the lower stacked film 22a and the upper stacked film 22b. The intermediate stacked film 22c includes a plurality of electrode layers 31 and a plurality of insulators 32 alternately stacked on the lower stacked film 22a. The intermediate stacked film 22c includes some of the word lines WL0 to WLn−1.

The intermediate columnar portion 23c is formed in an intermediate memory hole MMH provided in the intermediate stacked film 22c. The intermediate memory hole MMH is formed between the lower memory hole LMH and the upper memory hole UMH. Therefore, the intermediate columnar portion 23c is formed between the lower columnar portion 23a and the upper columnar portion 23b. The lower memory hole LMH and the intermediate memory hole MMH are coupled together with a lower joint portion (not illustrated) provided between the lower memory hole LMH and the intermediate memory hole MMH. The intermediate memory hole MMH and the upper memory hole UMH are coupled together with an upper joint portion (not illustrated) provided between the intermediate memory hole MMH and the upper memory hole UMH.

Each of the lower columnar portion 23a, the intermediate columnar portion 23c, and the upper columnar portion 23b is formed of the same block insulator 33, charge storage layer 34, tunnel insulator 35, channel semiconductor layer 36, and core insulator 37. Accordingly, the channel semiconductor layer 36 in the intermediate columnar portion 23c is electrically connected to the channel semiconductor layer 36 in the lower columnar portion 23a and to the channel semiconductor layer 36 in the upper columnar portion 23b. The block insulator 33, the charge storage layer 34, the tunnel insulator 35, the channel semiconductor layer 36, and the core insulator 37 are formed in this order in each of the lower memory hole LMH, the intermediate memory hole MMH, and the upper memory hole UMH.

The NAND memory 101 includes a plurality of columnar portions 23 in the stacked film 22. FIG. 9 illustrates one of such columnar portions 23. Each columnar portion 23 forms a single NAND string STR. The columnar portion 23 illustrated in FIG. 9 forms the plurality of memory cells MT together with the word lines WL0 to WLn−1, and forms the source-side transistor ST together with the source-side select line SGS, and also forms the drain-side transistor DT together with the drain-side select line SGD.

The NAND string STR illustrated in FIG. 9 is included in a single block in the memory cell array 1. In the SBM of the present embodiment, such a block is divided into three sub-blocks, and the block is accessed in a different way for each sub-block. In the present embodiment, memory cells MT in the lower memory hole LMH (i.e., the lower columnar portion 23*a*) belong to a lower sub-block, memory cells MT in the upper memory hole UMH (i.e., the upper columnar portion 23*b*) belong to an upper sub-block, and memory cells MT in the intermediate memory hole MMH (i.e., the intermediate columnar portion 23*c*) belong to an intermediate sub-block. In such a case, the lower joint portion and the upper joint portion correspond to the respective boundaries between the adjacent sub-blocks. The respective boundaries between the adjacent sub-blocks may be located at positions different from the joint portions. Such sub-blocks are examples of a first sub-block, a second sub-block, and a third sub-block.

FIGS. 10A to 12B are diagrams for illustrating the operation of a memory system of the second embodiment. FIGS. 10A to 12B illustrate the operation of the NAND memory 101 in the SBM.

Figures 10A, 10B:
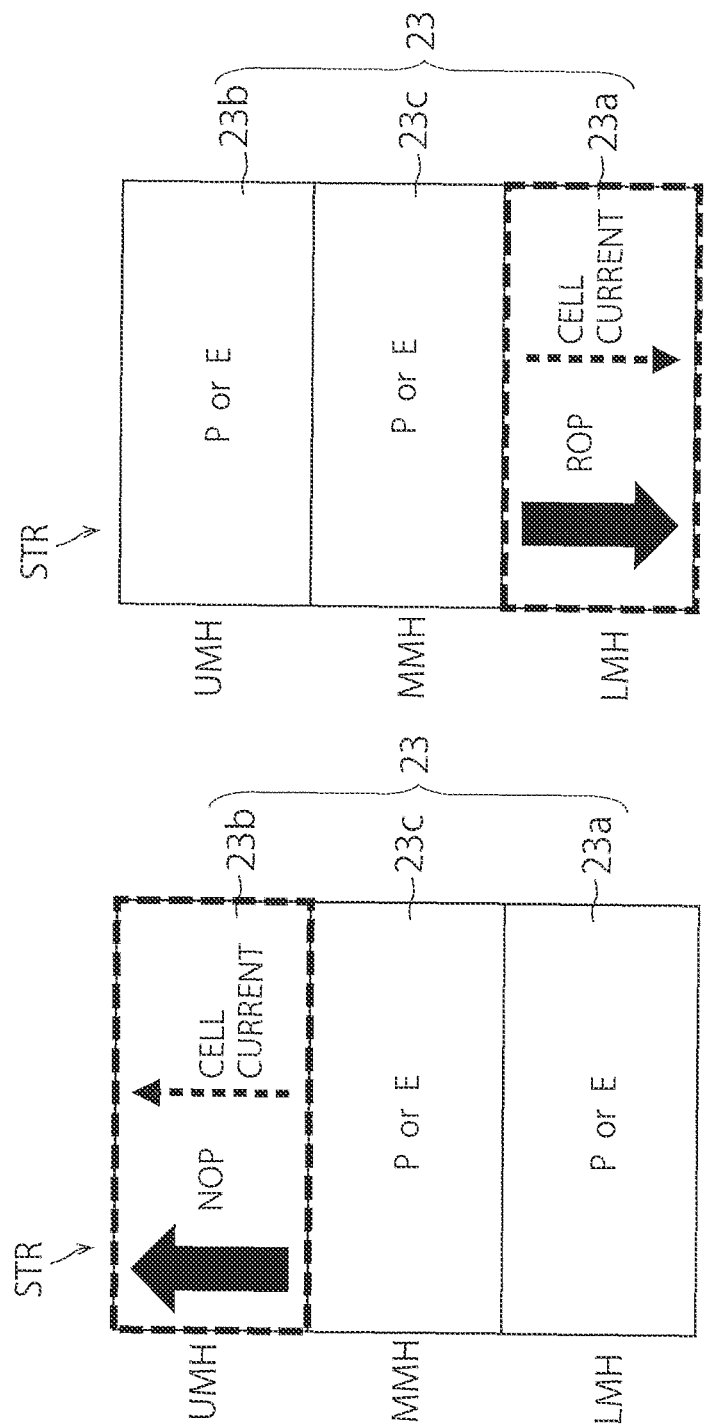

FIG. 10A schematically illustrates the shape of a single NAND string STR (i.e., the columnar portion 23). FIG. 10A further illustrates the lower columnar portion 23*a*, the upper columnar portion 23*b*, and the intermediate columnar portion 23*c* in the columnar portion 23; and the lower memory hole LMH, the intermediate memory hole MMH, and the upper memory hole UMH each including the columnar portion 23. The NAND string STR in the intermediate memory hole MMH is an example of a third portion. The memory cells MT in the intermediate memory hole MMH are examples of third memory cells.

In FIG. 10A, the states of the memory cells MT in the NAND string STR are indicated by reference sign P or reference sign E. Reference sign P indicates that the memory cells MT are data-written cells. Reference sign E indicates that the memory cells MT are data-erased cells. The data-written cells are memory cells MT having data written thereto. The data-erased cells are memory cells MT from which data has been erased and no new data has been written thereto thereafter. For example, when data is erased from a given block and new data is written to a give page in the block thereafter, each memory cell MT in such a page is a data-written cell. Meanwhile, when data is erased from a given block and no new data is written to any page in the block thereafter, each memory cell MT in the block is a data-erased cell.

In FIG. 10A, each memory cell MT in the lower memory hole LMH may be either a data-written cell or a data-erased cell, and each memory cell MT in the intermediate memory hole MMH may also be either a data-written cell or a data-erased cell. In such a case, the sense amplifier module 5 adopts the NOP for writing to the memory cells MT in the upper memory hole UMH. Further, the direction of a cell current that flows in the upper memory hole UMH during reading (which includes reading performed for verification purposes; hereinafter, the same) is set to the same direction as the direction of the NOP. This makes it possible to increase the writing speed for the upper memory hole UMH.

In FIG. 10B, each memory cell MT in the upper memory hole UMH may be either a data-written cell or a data-erased cell, and each memory cell MT in the intermediate memory hole MMH may also be either a data-written cell or a data-erased cell. In such a case, the sense amplifier module 5 adopts the ROP for writing to the memory cells MT in the lower memory hole LMH. Further, the direction of a cell current that flows in the lower memory hole LMH during reading is set to the same direction as the direction of the ROP. This makes it possible to increase the writing speed for the lower memory hole LMH.

Figures 11A, 11B:
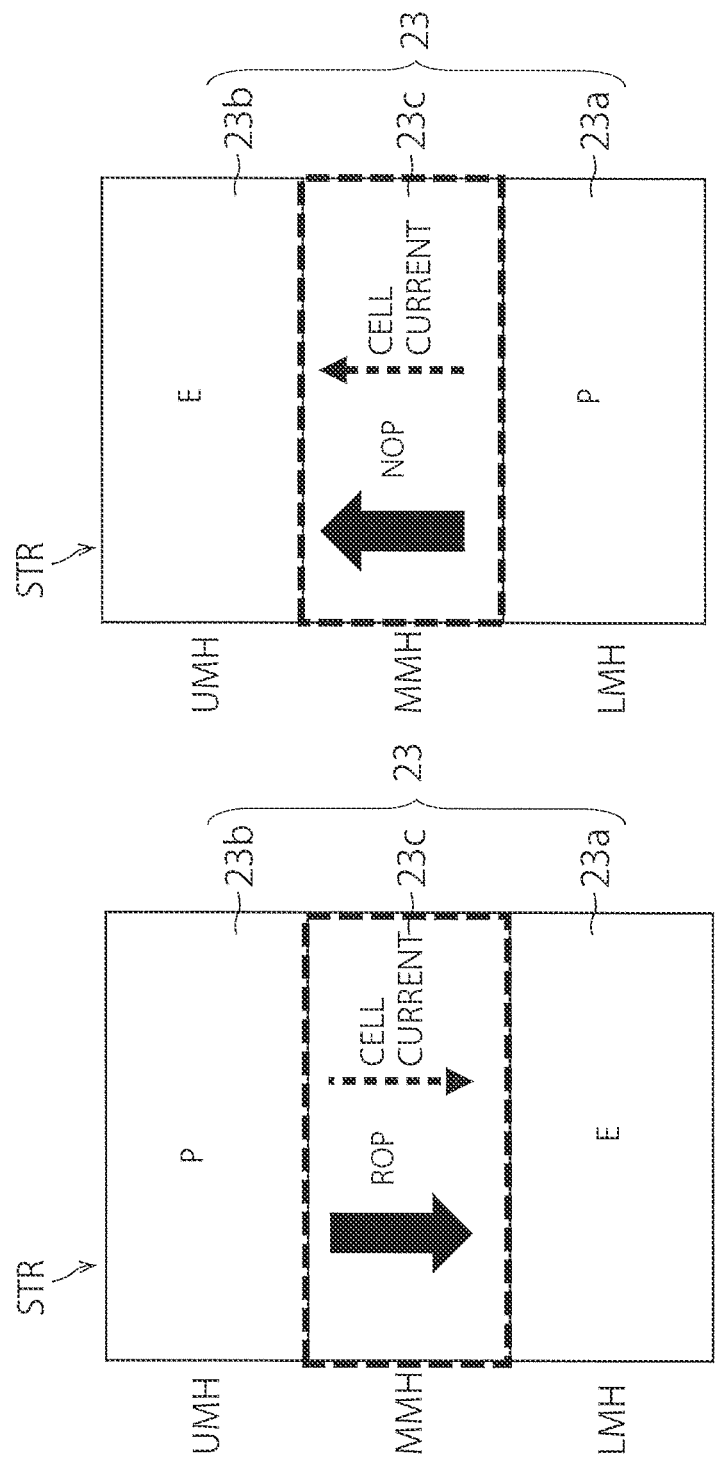

In FIG. 11A, each memory cell MT in the lower memory hole LMH is a data-erased cell, and each memory cell MT in the upper memory hole UMH is a data-written cell. In such a case, the sense amplifier module 5 adopts the ROP for writing to the memory cells MT in the intermediate memory hole MMH. Further, the direction of a cell current that flows in the intermediate memory hole MMH during reading is set to the same direction as the direction of the ROP.

In FIG. 11B, each memory cell MT in the lower memory hole LMH is a data-written cell, and each memory cell MT in the upper memory hole UMH is a data-erased cell. In such a case, the sense amplifier module 5 adopts the NOP for writing to the memory cells MT in the intermediate memory hole MMH. Further, the direction of a cell current that flows in the intermediate memory hole MMH during reading is set to the same direction as the direction of the NOP.

Figures 12A, 12B:
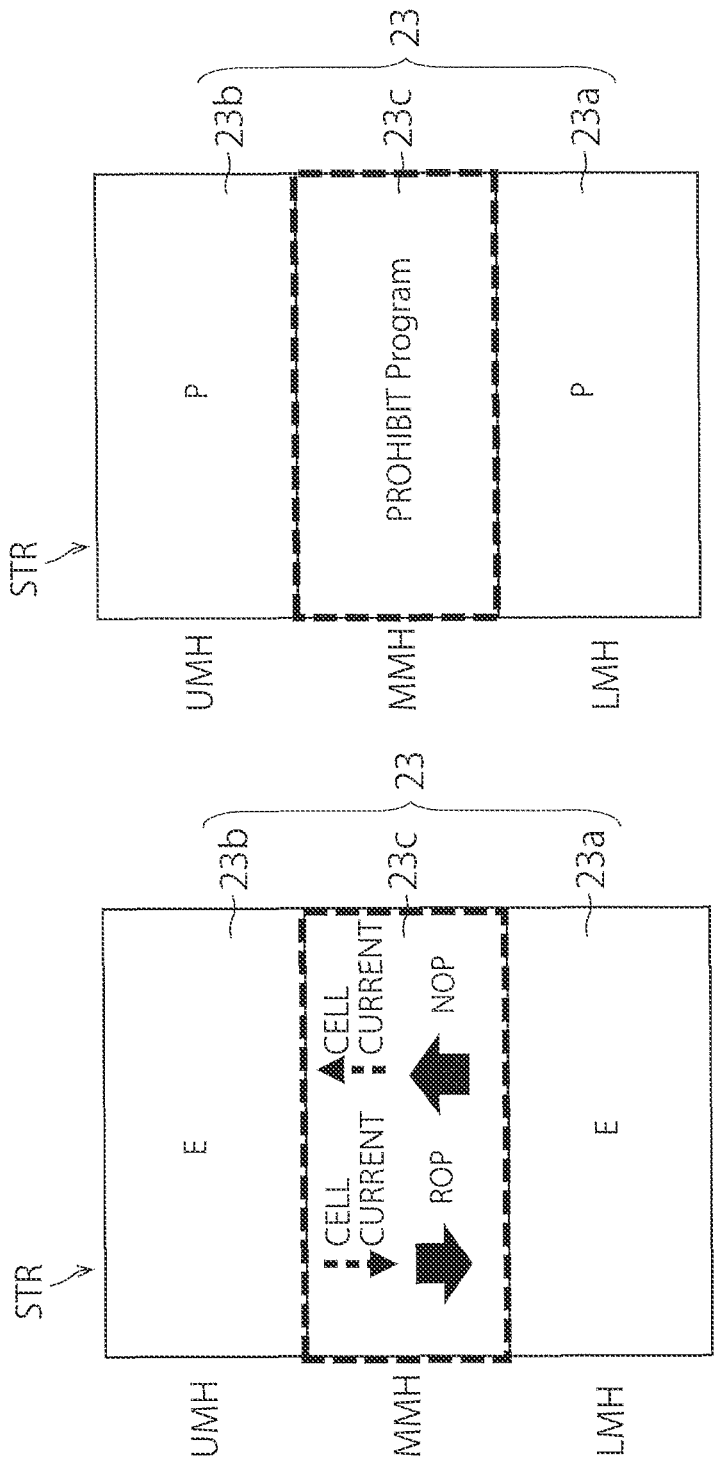

In FIG. 12A, each memory cell MT in the lower memory hole LMH is a data-erased cell, and each memory cell MT in the upper memory hole UMH is also a data-erased cell. In such a case, the sense amplifier module 5 may adopt either the ROP or the NOP for writing to the memory cells MT in the intermediate memory hole MMH. Further, the direction of a cell current that flows in the intermediate memory hole MMH during reading is set to the same direction as the writing direction. That is, when the writing is performed based on the ROP, the direction of a cell current that flows during the reading is set to the same direction as the direction of the ROP. Meanwhile, when the writing is performed based on the NOP, the direction of a cell current that flows during the reading is set to the same direction as the direction of the NOP.

In FIG. 12B, each memory cell MT in the lower memory hole LMH is a data-written cell, and each memory cell MT in the upper memory hole UMH is also a data-written cell. In such a case, the sense amplifier module 5 prohibits writing to the memory cells MT in the intermediate memory hole MMH.

According to the present embodiment, adopting the methods in FIGS. 11A to 12B can increase the writing speed for the intermediate memory hole MMH. In addition, according to the present embodiment, adopting the methods in FIG. 11A to 12B can perform writing to the memory cells MT in the intermediate memory hole MMH while taking into consideration the presence of data-written cells in the lower memory hole LMH and the upper memory hole UMH.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor storage device comprising a string that has one end electrically connected to a bit line, and another end electrically connected to a source line, and includes a plurality of memory cells, the string including:
a first portion including a plurality of adjacent first memory cells among the plurality of memory cells; and
a second portion including a plurality of adjacent second memory cells among the plurality of memory cells, and located on a side of the source line with respect to the first portion,
wherein:
an operation of writing data to each of the plurality of adjacent first memory cells is sequentially performed in a direction from a first memory cell on the side of the source line to a first memory cell on a side of the bit line,
an operation of reading data from each of the plurality of adjacent first memory cells is performed to allow a current to flow through the string in a first direction from the source line to the bit line,
an operation of writing data to each of the plurality of adjacent second memory cells is sequentially performed in a direction from a second memory cell on the side of the bit line to a second memory cell on the side of the source line,
an operation of reading data from each of the plurality of adjacent second memory cells is performed to allow a current to flow through the string in a second direction from the bit line to the source line, and
a direction of writing data to the first memory cells and a direction of writing data to the second memory cells are controlled by a sense amplifier in response to an instruction from a controller that is configured to control the semiconductor storage device.

2. The device of claim 1, wherein the operation of writing data to each of the plurality of adjacent first memory cells is performed to allow positive charges to be supplied into the string in the first direction.

3. The device of claim 1, wherein the operation of writing data to each of the plurality of adjacent first memory cells is performed to allow a current to flow through the string in the first direction during reading performed for verification purposes.

4. The device of claim 1, wherein the first portion further includes a drain-side select transistor, the second portion further includes a source-side select transistor, and the first memory cells and the second memory cells are provided between the drain-side select transistor and the source-side select transistor.

5. The device of claim 1, wherein the first memory cells and the second memory cells are respectively included in a first sub-block and a second sub-block that are in one block.

6. The device of claim 1, wherein:
the operation of reading data from each of the plurality of adjacent first memory cells is performed to allow a current to flow through the first portion in the first direction, and
the operation of reading data from each of the plurality of adjacent second memory cells is performed to allow a current to flow through the second portion in the second direction.

7. The device of claim 1, wherein;
the operation of writing data to each of the plurality of adjacent first memory cells is performed to allow positive charges to be supplied into the first portion in the first direction, and
the operation of writing data to each of the plurality of adjacent second memory cells is performed to allow positive charges to be supplied into the second portion in the second direction.

8. The device of claim 1, wherein:
the operation of writing data to each of the plurality of adjacent first memory cells is performed to allow a current to flow through the first portion in the first direction during reading performed for verification purposes, and
the operation of writing data to each of the plurality of adjacent second memory cells is performed to allow a current to flow through the second portion in the second direction during reading performed for verification purposes.

9. The device of claim 1, wherein the string further includes a third portion that is provided between the first portion and the second portion, and includes a plurality of adjacent third memory cells.

10. The device of claim 9, wherein an operation of writing data to each of the plurality of adjacent third memory cells is sequentially performed in a direction from a third memory cell on the side of the source line to a third memory cell on the side of the bit line, when the first memory cells are data-erased cells and the second memory cells are data-written cells.

11. The device of claim 9, wherein an operation of writing data to each of the plurality of adjacent third memory cells is sequentially performed in a direction from a third memory cell on the side of the bit line to a third memory cell on the side of the source line, or in a direction from the third memory cell on the side of the source line to the third memory cell on the side of the bit line, when the first memory cells and the second memory cells are data-erased cells.

12. The device of claim 9, wherein an operation of writing data to each of the plurality of adjacent third memory cells is prohibited, when the first memory cells and the second memory cells are data-written cells.

13. The device of claim 9, wherein an operation of reading data from each of the plurality of adjacent third memory cells is performed to allow a direction of a current that flows through the third portion to be identical to a direction of writing data to the third memory cells.

14. The device of claim 9, wherein an operation of writing data to each of the plurality of adjacent third memory cells is performed to allow a direction of a current that flows through the third portion during reading performed for verification purposes to be identical to a direction of writing data to the third memory cells.

15. The device of claim 9, wherein the first memory cells, the second memory cells and the third memory cells are respectively included in a first sub-block, a second sub-block, and a third sub-block that are in one block.

16. The device of claim 9, wherein the direction of writing data to the first memory cells, the direction of writing data to the second memory cells, and a direction of writing data to the third memory cells are controlled by the sense amplifier in response to an instruction from the controller.

17. A semiconductor storage device comprising a string that has one end electrically connected to a bit line, and another end electrically connected to a source line, and includes a plurality of memory cells,
the string including:
a first portion including a plurality of adjacent first memory cells among the plurality of memory cells;
a second portion including a plurality of adjacent second memory cells among the plurality of memory cells, and located on a side of the source line with respect to the first portion; and a third portion including a plurality of adjacent third memory cells among the plurality of memory cells, and provided between the first portion and the second portion, wherein:

an operation of writing data to each of the plurality of adjacent first memory cells is sequentially performed in a direction from a first memory cell on the side of the source line to a first memory cell on a side of the bit line, an operation of reading data from each of the plurality of adjacent first memory cells is performed to allow a current to flow through the string in a first direction from the source line to the bit line, an operation of writing data to each of the plurality of adjacent second memory cells is sequentially performed in a direction from a second memory cell on the side of the bit line to a second memory cell on the side of the source line, an operation of reading data from each of the plurality of adjacent second memory cells is performed to allow a current to flow through the string in a second direction from the bit line to the source line, an operation of writing data to each of the plurality of adjacent third memory cells is sequentially performed in a direction from a third memory cell on the side of the bit line to a third memory cell on the side of the source line, when the first memory cells are data-written cells and the second memory cells are data-erased cells.

18. A memory system comprising:

a storage device; and a controller configured to control the storage device, the storage device including a string that has one end electrically connected to a bit line, and another end electrically connected to a source line, and includes a plurality of memory cells, the string including:

a first portion including a plurality of adjacent first memory cells among the plurality of memory cells; and a second portion including a plurality of adjacent second memory cells among the plurality of memory cells, and located on a side of the source line with respect to the first portion, wherein:

an operation of writing data to each of the plurality of adjacent first memory cells is sequentially performed in a direction from a first memory cell on the side of the source line to a first memory cell on a side of the bit line, an operation of reading data from each of the plurality of adjacent first memory cells is performed to allow a current to flow through the string in a first direction from the source line to the bit line, an operation of writing data to each of the plurality of adjacent second memory cells is sequentially performed in a direction from a second memory cell on the side of the bit line to a second memory cell on the side of the source line, an operation of reading data from each of the plurality of adjacent second memory cells is performed to allow a current to flow through the string in a second direction from the bit line to the source line, and a direction of writing data to the first memory cells and a direction of writing data to the second memory cells are controlled by a sense amplifier provided in the storage device in response to an instruction from the controller to the storage device.

* * * * *